(12) United States Patent
Basceri et al.

(10) Patent No.: US 7,276,117 B2
(45) Date of Patent: Oct. 2, 2007

(54) METHOD OF FORMING SEMI-INSULATING SILICON CARBIDE SINGLE CRYSTAL

(75) Inventors: Cem Basceri, Reston, VA (US);
Nikolay Yushin, Reston, VA (US);
Cengiz M. Balkas, Reston, VA (US)

(73) Assignee: Cree Dulles, Inc., Sterling, VA (US)

( * ) Notice: Subject to any disclaimer, the term of this patent is extended or adjusted under 35 U.S.C. 154(b) by 205 days.

(21) Appl. No.: 11/052,899

(22) Filed: Feb. 9, 2005

(65) Prior Publication Data

US 2006/0174825 A1    Aug. 10, 2006

(51) Int. Cl.
*C30B 25/12*    (2006.01)
*C30B 25/14*    (2006.01)

(52) U.S. Cl. .................. 117/88; 117/84; 117/103; 117/105

(58) Field of Classification Search .............. 117/84, 117/88, 103, 105
See application file for complete search history.

(56) References Cited

U.S. PATENT DOCUMENTS

| | | | |
|---|---|---|---|
| 5,272,121 A * | 12/1993 | Mizutani et al. .............. 501/90 |
| RE34,861 E | 2/1995 | Davis et al. |
| 5,611,955 A | 3/1997 | Barrett et al. |
| 5,718,760 A | 2/1998 | Carter et al. |
| 5,856,231 A | 1/1999 | Niemann et al. |
| 5,964,943 A | 10/1999 | Stein et al. |
| 6,218,680 B1 | 4/2001 | Carter, Jr. et al. |
| 6,396,080 B2 | 5/2002 | Carter, Jr. et al. |
| 6,403,982 B2 | 6/2002 | Carter, Jr. et al. |
| 6,639,247 B2 | 10/2003 | Carter, Jr. et al. |
| 7,018,597 B2 * | 3/2006 | Ellison et al. .............. 423/345 |
| 2003/0079676 A1 | 5/2003 | Ellison et al. |
| 2004/0201024 A1 | 10/2004 | Tsvetkov et al. |

OTHER PUBLICATIONS

R.C. Glass et al., SiC-Seeded Crystal Growth, MRS Bulletin, Mar. 1997, pp. 30-35.
A.S. Bakin et al., Optically Transparent 6H-Silicon Carbide, Materials Science Forum, 1998, pp. 53-56, vols. 264-268, Trans Tech Publications, Switzerland.
W.J. Choyke et al., Physical Properties of SiC, MRS Bulletin, Mar. 1997, pp. 25-29.

* cited by examiner

*Primary Examiner*—Felisa Hiteshew
(74) *Attorney, Agent, or Firm*—Volentine & Whitt, PLLC

(57) ABSTRACT

Embodiments related to a method of forming semi-insulating silicon carbide (SiC) single crystal are disclosed in which shallow donor levels originating, at least in part, from residual nitrogen impurities are compensated by the addition of one or more trivalent element(s) introduced by doping the SiC in a concentration that changes the SiC conductivity from n-type to semi-insulating. Related embodiments provide for the additional doping of the SiC single crystal with one or more deep level dopants. However, the resulting concentration of deep level dopants, as well as shallow donor or acceptor dopants, is not limited to concentrations below the detection limits of secondary ion mass spectrometry (SIMS) analysis.

36 Claims, No Drawings

METHOD OF FORMING SEMI-INSULATING SILICON CARBIDE SINGLE CRYSTAL

BACKGROUND OF THE INVENTION

1. Field of the Invention

The invention relates generally to a method of forming a semi-insulating silicon carbide (SiC) single crystal. More particularly, the invention relates to a method of forming a semi-insulating SiC single crystal without increasing the concentration of intrinsic defects associated with the SiC.

2. Description of the Related Art

A semiconductor is a solid crystalline material whose electrical conductivity is intermediate that of a conductor and an insulator. Semiconductors exhibit resistivity between about $10^{-3}$ ohm-cm and $10^9$ ohm-cm. "Semi-insulating" semiconductors constitute a special class of semiconductors formed from materials having a resistivity of at least $10^3$ ohm-cm. Semi-insulating semiconductors include, for example, SiC, GaAs, GaP, InP, CdTe, GaN, and AlN, and find application across a broad range of applications including microwave devices and optoelectronics.

In order to achieve a resistivity consistent with semi-insulating behavior, shallow donor and/or acceptor levels originating from impurities in the semiconductor material must be eliminated or compensated. Two general approaches to the compensation of shallow donor/acceptor levels resulting from impurities in a semiconductor material have been identified; one relies on the intentional doping of the semi-conductor material with one or more transition or heavy metal impurities, and the other relies on the formation of intrinsic (naturally occurring) defects in the semiconductor material. (See, for example, D. Nolte, J. Appl. Physics, Vol. 85, No. 9, pp. 6259-89 (1999)).

The first of these two general approaches is described, for example, in U.S. Pat. No. 5,611,955 in which a deep level dopant is introduced into a process used to form a SiC single crystal. A transition metal such as vanadium is proposed as a deep level dopant. The second of the two general approaches is disclosed, for example, in U.S. Pat. No. 6,218,680 in which intrinsic point defects are intentionally and additionally introduced into the semiconductor material during its formation process. Both of these approaches can effectively compensate for the dominating type of shallow acceptors or shallow donors. However, both approaches suffer from certain drawbacks.

For example, proponents of the second approach recognize the well-established fact that production of a semi-insulating SiC single with heavy or transition metal doping can in certain circumstances lead to deterioration in crystal quality and/or low process yield due to non-uniform dopant profiles, and/or second phase or segregation effects. (See, for example, J. R. Jenny, *Appl. Physics Letters*, Vol. 68, No. 14, p. 1963 (1996)). Thus, the second approach seeks to overcome these complications by the use of intrinsic point defects acting as deep levels compensating the free carriers introduced into the SiC single crystal by shallow level acceptors or donors. Intrinsic point defects include vacancies, antisites, interstitials and similar imperfections, as well as pairs, complexes, and precipitates of these intrinsic point defect types, that naturally occur in the lattice structure of the semiconductor material.

In turn, however, the second approach, which is characterized by an increased number of intrinsic defects, is not without its own problems. For example, U.S. Published Patent Application No. 2003/0079676, incorporated herein by reference, recognizes that certain intrinsic point defects are thermally unstable, and if used in a semi-insulating SiC substrate, the resistivity of the substrate may not be well controlled across a range of operating conditions or throughout a sequence of processing steps applied to the substrate. For example, some annealing steps applied to the SiC substrate may remove the silicon vacancies relied upon, in part, to produce the substrate's semi-insulating behavior. Additionally, traps formed by the intrinsic point defects in the SiC substrate can cause collapse of drain-source currents for certain devices formed on the SiC substrate, such as Schottky gate field effect transistors.

Accordingly, U.S. Published Patent Application No. 2003/0079676 seeks to balance a suitable combination of deep levels, both acceptor and donor, as well as intrinsic and extrinsic in nature. Supposedly, such a combination of intrinsic defects and extrinsic defects can be adjusted, such that the effect on electrical behavior of the SiC resulting from the extrinsic defects is balanced or compensated by an opposite effect from the intrinsic defects. Unfortunately, this approach requires a level of deep level dopants, that while less than the level of the first approach referenced above, is yet too high.

In yet another conventional approach, U.S. Pat. No. 5,856,231 suggests that nitrogen impurities having a concentration less than $5 \times 10^{16}$ cm$^{-3}$ may be "overcompensated" by the addition of a trivalent element (preferably aluminum). Furthermore, this approach suggests adding a transition element (preferably vanadium) having, at least in SiC, donor levels in the center of the energy gap in order to compensate for excess acceptor levels. As such, this approach requires the use of both shallow level and deep level dopants to obtain semi-insulating behavior since aluminum is intentionally added in overcompensating amounts higher than that needed for the compensation of nitrogen impurities.

SUMMARY OF THE INVENTION

The invention, at least in one embodiment, provides a method of forming a semi-insulating silicon carbide (SiC) single crystal in which one or more trivalent element(s) is (are) introduced as a dopant to the SiC in a concentration that compensates shallow donor levels originating, at least in part, from residual nitrogen impurities.

In a related embodiment, boron and/or aluminum are preferred trivalent elements. Where used, boron may be added from a graphite source via a solid state diffusion process or by introduction of gaseous boron. Alternatively or additionally, boron may be added to (or provided by) the source material used in the SiC formation process. In this context, the source material may take any practical form, including solid (e.g., a polycrystalline source), powdered solid, liquid (e.g., one or more polymers), and/or gaseous. Further, the source material may be pure or pre-reacted (or pre-doped) to contain a specified concentration of a desired dopant(s).

For example, in one related aspect, the graphite source used in a solid state diffusion process may take the form of an insulated crucible in which the SiC single crystal is formed. In another related aspect, the gaseous boron may be boron hydride, boron trihydride, diborane, or diboron hexahydride.

In another embodiment, the invention provides a method of forming a semi-insulating SiC single crystal comprising further doping the SiC described above with a deep level dopant. Any element selected from periodic element groups IB, IIB, IIIB, IVB, VB, VIB, VIIB, or VIIIB may be used as a deep level dopant, but in selected embodiments of the invention, vanadium and/or titanium are preferred deep level dopants.

In a related aspect, the concentration of these deep level dopants within semi-insulating SiC formed in accordance with selected embodiments of the invention is markedly lower than concentrations originating from conventional approaches using only deep level dopant(s) as a charge compensation mechanism. This result is possible due to the foregoing balancing of shallow level donor and acceptor levels. However, it should be noted with respect to this particular aspect of selected embodiments of the invention that the resulting concentration of deep level dopants is not necessarily limited to concentrations below the limits of detection using secondary ion mass spectrometry (SIMS) analysis.

In yet another embodiment, the invention provides a method of forming a semi-insulating SiC single crystal on a SiC seed in an insulated crucible. The method comprises providing SiC source material and the SiC seed in the insulated crucible and heating the insulated crucible to form a thermal gradient between the SiC source material and the SiC seed to effect a physical vapor transport (PVT) process, whereby silicon and carbon species are transported from the SiC source material to the SiC seed. The method further comprises introducing at least one trivalent impurity into the PVT process in a concentration sufficient to compensate shallow donor levels originating, at least in part, from residual nitrogen impurities.

In a related aspect, the insulated crucible may be engineered to have a specific boron content, such that concentration of boron would be sufficient to compensate the shallow donor levels and change the conductivity of the SiC from n-type to semi-insulating. Alternatively or additionally, boron may be added to (or provided by) the source material used in the SiC formation process.

DESCRIPTION OF THE EXEMPLARY EMBODIMENTS

The invention addresses the shortcomings associated with semi-insulating, silicon carbide (SiC) single crystal formed using conventional approaches. In particular, embodiments of the invention form semi-insulating SiC single crystal using a method in which the introduction of deep level dopants may be minimized or eliminated. As a result, the deleterious effects (e.g., second phase formation and segregation effects) typically associated with deep level doping of SiC are avoided and yields improved. All embodiments of the invention form semi-insulating SiC single crystal without intentionally increasing the intrinsic defect density within the SiC single crystal.

The term "dopant" as used throughout this description means an atom other than silicon (Si) or carbon (C) present in the atomic lattice of a SiC single crystal that provides either an extra electron (donor) or an extra hole (acceptor). In the context of processes consistent with the invention, dopants may either be passively or proactively provided. That is, the term "doping" may refer to a specific additive process step (or sequence of steps), or the omission of same from the overall process used to form the SiC single crystal.

Embodiments of the invention are drawn to a method of forming SiC single crystal. The desirable properties of SiC are well known, including a wide band gap ranging from 2.2 eV in the beta polytype, to 2.4 eV in the cubic 3D polytype, up to 3.3 eV in the hexagonal 4H polytype. Other desirable properties of SiC include a high thermal conductivity and high stability in harsh environments (such as high temperature and/or radiation) particularly when compared to conventional silicon. These properties make SiC an excellent choice for a semiconductor substrate upon which optical, electrical, and opto-electrical devices may be formed. Again, when compared to devices formed on a conventional silicon substrate, devices formed on a SiC substrate are generally expected to perform better at much higher operating frequencies, power levels, temperature and radiation densities.

Most practical applications for SiC substrates require a substrate cut from a single crystal of silicon carbide. That is, the desirable electrical properties noted above are usefully found in SiC single crystals, not polycrystalline SiC.

Thus, the formation of SiC single crystals has been the subject of intense research. An excellent summary of the conventional SiC single crystal formation method is presented in U.S. Reissue Pat. No. 34,861, which is incorporated herein by reference. Additional insights into methods adapted to the formation of SiC single crystals using a seeded, physical vapor transport (PVT) process are presented in R. C. Glass et al., "SiC-Seeded Crystal Growth," *Mat. Research Soc.* (*MRS*) *Bulletin*, pp. 30-35 (March 1997).

While selected embodiments of the invention are described hereafter in the context of PVT formation process, those of ordinary skill in the art will recognize that the invention is equally applicable to gas, liquid, and/or bulk growth techniques and processes adapted to the formation of SiC single crystal. It should be further noted that the invention finds ready application not only in processes adapted to the formation of bulk SiC single crystals, but also in processes adapted to the formation of a SiC epitaxial layer. The term "epitaxial" refers to the formation of any single crystal semiconductor film on a single crystal substrate. The epitaxial layer typically possesses the same crystallographic characteristics as the substrate material. Thus, the invention may find application in chemical vapor deposition (CVD) processes and molecular beam epitaxy (MBE) processes, for example.

Returning to the context of bulk SiC single crystal formation, as described for example in the foregoing article and similar documents, the well known physical vapor transport (PVT) process is used in this description as one example of a SiC formation method susceptible to the benefits of the invention. The PVT process is performed in an insulated crucible (or vessel) in which SiC source material is placed in a bottom portion and a high crystal quality SiC seed is placed in a top portion. The term "insulated crucible" is used here to describe any vessel and/or its surrounding insulation material which is adapted for use within the context of a PVT process. After the SiC source material and SiC seed are loaded into the insulated crucible, they are heated until a desired thermal gradient is established between the two elements. Species of silicon (Si) and carbon (C) liberated from the heated SiC source material are transported to the SiC seed and deposited to form a SiC single crystal boule. The resulting SiC boule may subsequently be sliced into thin wafers to form SiC substrates. It is also conventionally known to introduce various dopants into the PVT process.

Yet, the conventional PVT process is not without its problems. Foremost among these problems is the undesired incorporation of nitrogen impurities from the surrounding environment into the resulting SiC single crystal boule. In large measure, it is the presence of shallow donor levels resulting, at least in part, from the "residual nitrogen impurities" that must be addressed in any effort to successfully form SiC single crystal having semi-insulating behavior.

In order to be semi-insulating in a practical sense, SiC single crystal must have a resistivity of at least 5000 ohm-cm at room temperature, and preferably $10^5$ ohm-cm. This range of resistivity ensures isolation between devices subsequently formed on a SiC substrate and thereby minimizes backgating effects. Unfortunately, if left uncompensated, the shallow donor levels resulting mainly from residual nitrogen impurities—present at approximately 0.1 eV below the conduction band—result in a SiC single crystal having an n-type conductivity and a resistivity far less than that required for semi-insulating behavior. That is, residual nitrogen impurities produce shallow level donors which greatly increase the conductivity of SiC due to resulting electron emission into the conduction band.

The successive conventional efforts described above were directed in large measure to the issue of undesired residual nitrogen impurities in SiC single crystal intended to be semi-insulating in its electrical behavior. The invention, however, successfully addresses this issue using technique(s) ignored by or specifically rejected by the conventional approaches.

Embodiments of the invention are well adapted for use within the general dictates of conventional PVT processes, as well as other processes adapted to the formation of bulk SiC or SiC epitaxial layers (e.g., CVD and MBE). A great variety of SiC source materials may be used within these processes, including solid, powdered, liquid and/or gaseous types of source materials.

Further, the present invention recognizes the benefits of generally reducing the quantity of residual nitrogen impurities in a SiC boule or SiC epitaxial layer formed according to any one of the foregoing SiC formation processes. Multiple conventional techniques have been proposed for reducing residual nitrogen impurities. Such techniques emphasize, for example, the use of a high quality vacuum system to remove nitrogen bearing gases from the SiC formation environment (e.g., out-gassing of the porous insulation components in a PVT process). Indeed, nitrogen bearing gases may permeate any of the porous components typically found in the SiC formation environment, including the surrounding insulation, the source material, etc. In some techniques, the use of ultra high grade (i.e., nearly impurity free) source materials and/or ultra pure make-up gases is emphasized. Make-up (e.g., inert or noble) gases such as argon and helium are commonly used to pressurize the SiC formation environment in order to force out (out-gas and exhaust) nitrogen bearing gases. Such gases can also be delivered to the crystal growth zone in a competent SiC formation process using purifiers which reduce the background impurities apparent in the process, including nitrogen.

One or more of these conventional techniques taken singularly or in combination may be implemented at the process designer's discretion with varying degrees of benefit to the formation of SiC. Such benefits, however, come at notable cost, and the invention recognizes the practical limits of such conventional techniques. Accordingly, the invention further recognizes that some quantity of residual nitrogen impurities will be incorporated into a SiC boule or SiC layer formed by conventional processes, such as PVT.

Accordingly, in one embodiment, the invention provides a method of forming semi-insulating SiC single crystal, wherein shallow donor levels resulting, at least in part, from residual nitrogen impurities are compensated by the addition of one or more trivalent element(s) to a process forming a SiC single crystal (whether bulk SiC or an SiC epitaxial layer). The trivalent element(s) may be introduced by doping the SiC single crystal and should be introduced in a concentration that essentially or substantially changes the conductivity type of the SiC from n-type to semi-insulating. Trivalent elements include boron, aluminum, gallium, indium, or thallium. In several embodiments, boron and/or aluminum are currently preferred trivalent dopants.

Within this context, embodiments of the invention recognize that left uncompensated, the shallow donor levels provided, at least in part, by the residual nitrogen impurities would produce SiC having an n-type conductivity. Introduction of the trivalent element(s) in proper measure will provide or enable compensation for the shallow donor levels and change (i.e., produce) the conductivity type for the SiC single crystal from the n-type that would otherwise result, to semi-insulating.

Where aluminum is selected as a trivalent dopant, it may be introduced using any one of a number of conventional techniques. For example, a pre-doped (pre-reacted) source material may be used, an aluminum bearing gas may be introduced into the SiC formation process, and/or solid or powdered aluminum may be added to the source material, etc.

Similarly, where boron is selected as a trivalent dopant, it may be introduced using a number of different techniques including, for example, introducing boron through a solid diffusion process. Solid state diffusion of boron may result from a graphite source forming all or part of the insulated crucible, or a graphite source specifically introduced into the SiC formation process. Indeed, in one embodiment of the invention directed to a PVT process, an insulated crucible is specifically engineered to provide an appropriate mass of graphite, such that a desired concentration of boron is released from the graphite during the SiC formation process.

Additionally or alternatively, a solid (e.g., polycrystalline), or a liquid (e.g., metallorganic) boron bearing material may be added to the source material used in the SiC formation process.

Additionally or alternatively, SiC source material pre-doped with boron, such as boron doped silicon, boron doped carbon, and/or some combination of boron doped silicon boron doped carbon may be used.

Additionally or alternatively, gaseous boron may be introduced into the process forming the SiC. Boron hydride, boron trihydride, diborane, and/or diboron hexahydride may be used for this purpose.

Where an appropriate concentration of one or more trivalent elements can be identified in relation to (1) the concentration of residual nitrogen and other donor impurities contaminating the SiC single crystal, (2) the density of intrinsic defects (donor and/or acceptor) within the SiC single crystal, and (3) the general conditions associated with the SiC formation process—no additional doping of the SiC single crystal with deep level dopants, such as transition or heavy metals is required. Accordingly, the noted drawbacks associated with high concentrations of such deep level dopants may be avoided. Further, the SiC single crystal resulting from embodiments of the invention exhibits exceptional semi-insulating behavior without the provision of intentionally added intrinsic defects.

It should additionally be noted that the trivalent elements added to the SiC formation process can be present in the resulting SiC single crystal in concentrations above the threshold of detection for conventional SIMS and still enable semi-insulating behavior.

The use of boron and/or aluminum to compensate for shallow donor levels originating in part from residual nitrogen impurities imparts notable, collateral, beneficial characteristics to the resulting SiC single crystal. For example, boron-balanced SiC single crystal is more optically transparent than many conventionally produced forms of SiC. The term "boron-balanced" refers to SiC single crystal having a quantity of boron (and/or other trivalent element) minimally sufficient in the ideal to compensate the shallow donors levels in which case additional benefit of compensation of color centers in the SiC can be realized. Thus, with improved transparency, boron-balanced SiC finds ready application in devices such as high-power light emitting diodes (LEDs) where its highly transparent nature makes it an ideal light extracting material.

Although the foregoing selected embodiments of the invention seek to minimize or eliminate the need for additional doping with deep level dopants, other embodiments of the invention recognize that some addition of deep level dopants may provide beneficial results. Indeed, the concentration of deep level dopants contemplated by embodiments of the invention may range above levels detectable by SIMS. Yet, the concentration of deep level dopants contemplated will be significantly less than the concentrations proposed by conventional approaches advocating the use of deep level dopants as the sole charge compensation mechanism (i.e. without intentional addition of shallow donor or acceptor dopants for balanced shallow energy states).

In particular, embodiments of the invention are contemplated wherein the SiC single crystal described above is additionally doped with one or more deep level dopant(s). The one or more deep level dopants may be one or more elements selected from any one the following periodic element groups: IB, IIB, IIIB, IVB, VB, VIB, VIIB, or VIIIB. In selected embodiments, vanadium and titanium are presently preferred deep level dopants.

Thus, another embodiment of the invention provides a method of forming a semi-insulating silicon carbide (SiC) single crystal electrically characterized (e.g., having a resulting conductivity or resistivity) by concentrations of at least (1) shallow donor levels resulting from residual nitrogen impurities ($N_N$), (2) donor type intrinsic defects (both deep and shallow) ($N_D$), and (3) acceptor type intrinsic defects (both deep and shallow) ($N_A$). The method comprises doping the SiC with a concentration of at least one trivalent impurity ($N_{TE}$), such that donor type dopants and intrinsic defects are substantially balanced (i.e., compensated) by acceptor type dopants and intrinsic defects. Stated in terms of an equation, $N_N + N_D = N_A + N_{TE}$, where "=" means substantially equal in an electrical sense (i.e., resulting in semi-insulating behavior), rather than a molecular, mathematical or numerical sense.

In the foregoing embodiment, at least one trivalent impurity may be boron, aluminum, or boron and aluminum.

In a related embodiment, the SiC is doped not only with a concentration of at least one trivalent impurity ($N_{TE}$), but also with at least one deep level dopant. The resulting semi-insulating SiC single crystal may thus be further electrically characterized by a concentration of deep acceptor impurities ($N_{DLA}$), such that substantially, $N_{DLA} > (N_N - N_{TE})$, or by a concentration of deep donor impurities ($N_{DLD}$), such that substantially, $N_{DLD} > (N_{TE} - N_N)$. Throughout this description, the term "greater" (expressed in the equations above and hereafter by the symbol ">") should be understood as "slightly greater than" or "minimally sufficient" in order to be greater than, rather than "much greater than." This interpretation is logically consistent with embodiments of the inventions which seek to minimize the quantity of deep level dopant(s) added during the formation of SiC single crystal.

As a result, in embodiments of the invention where a concentration of deep level acceptors ($N_{DLA}$) exists, and where the at least one trivalent element comprises boron, aluminum, or boron and aluminum respectively, the following relationships should exist:

for a concentration of boron ($N_B$), $N_{DLA} > (N_N - N_B)$;

for a concentration of aluminum ($N_{Al}$), $N_{DLA} > (N_N - N_{Al})$; and, for concentrations of boron ($N_B$) and aluminum ($N_{Al}$), $N_{DLA} > (N_N - N_B + N_{Al})$.

Similarly, in embodiments of the invention where a concentration of deep level donors ($N_{DLD}$) exists, and where the at least one trivalent element again comprises boron, aluminum, or boron and aluminum respectively, the following relationships should exist:

for a concentration of boron ($N_B$), $N_{DLD} > (N_B - N_N)$;

for a concentration of aluminum ($N_{Al}$), $N_{DLD} > (N_{Al} - N_N)$; and, for concentrations of boron ($N_B$) and aluminum ($N_{Al}$), $N_{DLD} > (N_B + N_{Al} - N_N)$.

These relationships should hold in relevant embodiments whether the concentration of deep level acceptors ($N_{DLA}$) or the concentration of deep level donors ($N_{DLD}$) are naturally occurring (i.e., resulting from intrinsic defects) within the SiC single crystal or the result of additional doping with deep level dopant(s).

Embodiments of the invention may be used to form a SiC single crystal having different polytypes. The polytypism of SiC is also well documented. Indeed, one of the unique and conventionally confounding properties of SiC is its ability to exist in over 170 different polytypes. Generally speaking, the term "polytype" denotes a unique class of materials that possess the same chemical makeup but also possess a stacking sequence that vary along the c-axis of the constituent material. (See, for example, W. J. Choyke et al., "Physical Properties of SiC," *Mat. Research Soc. (MRS) Bulletin*, pp. 25-29 March 1997).

More specifically, embodiments of the. invention relate to methods of forming all practical polytypes of SiC, including at least 3C, 2H, 4H, 6H, and 15R. In one related embodiment, optically transparent, hexagonal 6H SiC is contemplated. (See, for example, A. S. Bakin et al., "Optically Transparent 6H-Silicon Carbide," *Materials Science Forum*, Vols. 264-268, pp. 33-36 (1998)).

Furthermore, embodiments of the invention find application in a broad range of processes adapted to the formation of a SiC single crystal. While a physical vapor transport process has been described above, this is but one current example of a process adapted to the formation of a SiC single crystal. Even in this limited and exemplary context, competent PVT SiC single crystal formation processes will be characterized by the use of varying types of insulated crucibles and related equipment, different types and compositions of SiC source materials and/or dopant materials, and different process conditions (e.g., temperature, pressure, etc.).

As previously noted, however, the invention is not limited to PVT processes, or bulk SiC formation processes, but may be readily adapted to other SiC formation processes such as CVD, MBE and similar processes generally used to form epitaxial SiC single crystal.

The foregoing description of exemplary embodiments, although presented in specific terms, is intended to generally describe the invention. Thus, the embodiments should be viewed as selected examples. The actual scope of the invention is defined by the attached claims.

What is claimed is:

1. A method of forming a semi-insulating silicon carbide (SiC) single crystal,
   wherein shallow donor levels originating, at least in part, from residual nitrogen impurities are compensated by the addition of boron introduced by doping the SiC in a concentration that changes the SiC from n-type conductivity to semi-insulating;
   wherein the boron is introduced via at least one of the following techniques; a solid state diffusion process from a qraphite source, introduction of qaseous boron, introduction of a boron-bearinq liquid, boron dopinq of SiC source material, and the addition of solid or powdered boron to the SiC source material.

2. The method of claim 1, wherein the graphite source comprises a thermally insulated crucible in which the SiC single crystal is formed.

3. The method of claim 1, wherein the gaseous boron comprises boron hydride, boron trihydride, diborane, or diboron hexahydride.

4. The method of claim 1, further comprising:
   doping the SiC with a deep level dopant.

5. The method of claim 4 wherein the deep level dopant is an element selected from periodic element groups IB, IIB, IIIB, IVB, VB, VIB, VIIB, or VIIIB.

6. The method of claim 5 wherein the deep level dopant is vanadium or titanium.

7. The method of claim 4, wherein the polytype of the SiC single crystal is selected from the group consisting of 4H, 6H, 15R and 3C.

8. The method of claim 1, wherein the polytype of the SiC single crystal is selected from the group consisting of 4H, 6H, 15R and 3C.

9. A method of forming a semi-insulating silicon carbide (SiC) single crystal,
   wherein shallow donor levels originating, at least in part, from residual nitrogen impurities are compensated by the addition of boron and aluminum introduced by doping the SiC in a concentration that changes the SiC from n-type conductivity to semi-insulating;
   wherein the boron is added via at least one of the following techniques; a solid state diffusion process from a graphite source, introduction of gaseous boron, introduction of a boron-bearing liquid, boron doping of SiC source material, and the addition of solid or powdered boron to the SiC source material.

10. The method of claim 9, wherein the graphite source comprises a thermally insulated crucible in which the SiC single crystal is formed.

11. The method of claim 9, wherein the gaseous boron comprises boron hydride, boron trihydride, diborane, or diboron hexahydride.

12. The method of claim 9, further comprising:
    doping the SiC with a deep level dopant.

13. The method of claim 12, wherein the deep level dopant comprises at least one element selected from periodic element groups IB, IIB, IIIB, IVB, VB, VIB, VIIB, or VIIIB.

14. The method of claim 12, wherein the deep level dopant comprises at least one of vanadium and titanium.

15. The method of claim 12, wherein the polytype of the SiC single crystal is selected from the group consisting of 4H, 6H, 15R and 3C.

16. The method of claim 9, wherein the polytype of the SiC single crystal is selected from the group consisting of 4H, 6H, 15R and 3C.

17. A method of forming a semi-insulating silicon carbide (SiC) single crystal on a SiC seed in a thermally insulated crucible, comprising:
    providing SiC source material and the SiC seed in the insulated crucible;
    heating the insulated crucible to form a thermal gradient between the SiC source material and the SiC seed to effect a physical vapor transport (PVT) process, whereby silicon and carbon species are transported from the SiC source material to the SiC seed;
    introducing at least one trivalent impurity, the trivalent impurity comprising boron or boron and aluminum, into the PVT process in a concentration sufficient to compensate shallow donor levels originating, at least in part, from residual nitrogen impurities; and,
    engineering the insulated crucible with a graphite content, such that a concentration of boron sufficient to compensate shallow donor levels originating, at least in part, from residual nitrogen impurities, and thereby change the conductivity of the SiC from n-type to semi-insulating is introduced into the PVT process.

18. The method of claim 17, wherein the introduction of boron into the PVT process further comprises:
    adding boron in solid, powdered solid, liquid or gaseous state to the PVT process.

19. The method of claim 18, further comprising:
    doping the SiC with a deep level dopant comprising at least one element selected from periodic element groups IB, IIB, IIIB, IVB, VB, VIB, VIIB, or VIIIB.

20. The method of claim 17, further comprising:
    doping the SiC with a deep level dopant comprising at least one element selected from periodic element groups IB, IIB, IIIB, IVB, VB, VIB, VIIB, or VIIIB.

21. The method of claim 20, wherein the polytype of the SiC single crystal is selected from the group consisting of 4H, 6H, 15R and 3C.

22. The method of claim 17, wherein the polytype of the SiC single crystal is selected from the group consisting of 4H, 6H, 15R and 3C.

23. A method of forming a semi-insulating silicon carbide (SiC) single crystal electrically characterized by concentrations of;
    shallow donor levels resulting, at least in part, from residual nitrogen impurities ($N_N$),
    donor type intrinsic defects ($N_D$), and,
    acceptor type intrinsic defects ($N_A$),
    wherein the method comprises:
    doping the SiC with a concentration of at least one trivalent impurity ($N_{TE}$), such that substantially, $N_N + N_D = N_A + N_{TE}$.

24. The method of claim 23, wherein the at least one trivalent impurity comprises, boron, aluminum, or boron and aluminum.

25. The method of claim 24, wherein the at least one trivalent element comprises:
    a concentration of boron ($N_B$), such that substantially, $N_{DLA} > (N_N - N_B)$;
    a concentration of aluminum ($N_{Al}$), such that substantially, $N_{DLA} > (N_N - N_{Al})$; or,
    concentrations of boron ($N_B$) and aluminum ($N_{Al}$), such that substantially, $N_{DLA > (NN} - N_B + N_{Al})$.

26. The method of claim 23, further comprising:
    additionally doping the SiC with at least one deep level dopant selected from periodic element groups IB, IIB, IIIB, IVB, VB, VIB, VIIB, or VIIIB, such that the semi-insulating silicon carbide (SiC) single crystal is further electrically characterized by a concentration of deep acceptor impurities ($N_{DLA}$), such that substantially, $N_{DLA} > (N_N - N_{TE})$.

27. The method of claim 26, wherein the at least one deep level dopant comprises vanadium or titanium.

28. The method of claim 26, wherein the polytype of the SiC single crystal is selected from the group consisting of 4H, 6H, 15R and 3C.

29. The method of claim 23, further comprising:
additionally doping the SiC with at least one deep level dopant selected from periodic element groups IB, IIB, IIIB, IVB, VB, VIB, VIIB, or VIIIB, such that the semi-insulating silicon carbide (SiC) single crystal is further electrically characterized by a concentration of deep donor impurities ($N_{DLD}$), such that substantially, $N_{DLD} > (N_{TE} - N_N)$.

30. The method of claim 29, wherein the at least one deep level dopant comprises vanadium or titanium.

31. The method of claim 29, wherein the at least one trivalent element comprises:
a concentration of boron ($N_B$), such that substantially, $N_{DLD} > (N_B - N_N)$;
a concentration of aluminum ($N_{Al}$), such that substantially, $N_{DLD} > (N_{Al} - N_N)$; or,
concentrations of boron ($N_B$) and aluminum ($N_{Al}$), such that substantially, $N_{DLD} > (N_B + N_{Al} - N_N)$.

32. The method of claim 23, wherein the SiC is further electrically characterized by a concentration of deep level acceptors ($N_{DLA}$), such that substantially, $N_{DLA} > (N_N - N_{TE})$.

33. The method of claim 32, wherein the at least one trivalent element comprises:
a concentration of boron ($N_B$), such that substantially, $N_{DLA} > (N_N - N_B)$;
a concentration of aluminum ($N_{Al}$), such that substantially, $N_{DLA} - (N_N - N_{Al})$; or,
concentrations of boron ($N_B$) and aluminum ($N_{Al}$), such that substantially, $N_{DLA} > (N_N - N_B + N_{Al})$.

34. The method of claim 23, wherein the SiC is further electrically characterized by a concentration of deep level donors ($N_{DLD}$), such that substantially, $N_{DLD} > (N_{TE} - N_N)$.

35. The method of claim 34, wherein the at least one trivalent element comprises:
a concentration of boron ($N_B$), such that substantially, $N_{DLD} > (N_B - N_N)$;
a concentration of aluminum ($N_{Al}$), such that substantially, $N_{DLD} > (N_{Al} - N_N)$; or,
concentrations of boron ($N_B$) and aluminum ($N_{Al}$), such that substantially, $N_{DLD} > (N_B + N_{Al} - N_N)$.

36. The method of claim 23, wherein the polytype of the SiC single crystal is selected from the group consisting of 4H, 6H, 15R and 3C.

* * * * *

UNITED STATES PATENT AND TRADEMARK OFFICE
CERTIFICATE OF CORRECTION

| | | |
|---|---|---|
| PATENT NO. | : 7,276,117 B2 | Page 1 of 1 |
| APPLICATION NO. | : 11/052899 | |
| DATED | : October 2, 2007 | |
| INVENTOR(S) | : Cem Basceri et al. | |

It is certified that error appears in the above-identified patent and that said Letters Patent is hereby corrected as shown below:

In column 8, line 38, "the. Invention" should read --the invention--.

Col. 9, line 11 of claim 1, "qraphite" should read --graphite--.

Col. 9, line 11 of claim 1, "qaseous" should read --gaseous--.

Col. 9, line 12 of claim 1, "dopinq" should read --doping--.

Signed and Sealed this

Eighth Day of April, 2008

JON W. DUDAS
*Director of the United States Patent and Trademark Office*